United States Patent
Abuellil et al.

(10) Patent No.: US 11,539,338 B2
(45) Date of Patent: Dec. 27, 2022

(54) RADIO FREQUENCY LEVEL INDICATOR

(71) Applicant: SHENZHEN GOODIX TECHNOLOGY CO., LTD., Shenzhen (CN)

(72) Inventors: Amr Abuellil, San Diego, CA (US); Faisal Hussien, San Diego, CA (US); Ayman Mohamed Elsayed, San Diego, CA (US); Ahmed Emira, San Diego, CA (US); Mohamed Aboudina, San Diego, CA (US)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/351,192

(22) Filed: Jun. 17, 2021

(65) Prior Publication Data

US 2022/0271723 A1 Aug. 25, 2022

Related U.S. Application Data

(60) Provisional application No. 63/152,839, filed on Feb. 23, 2021.

(51) Int. Cl.
*H03G 3/30* (2006.01)
*H03F 1/32* (2006.01)

(52) U.S. Cl.
CPC ............. *H03G 3/3068* (2013.01); *H03F 1/32* (2013.01); *H03G 3/3078* (2013.01); *H03F 2200/294* (2013.01); *H03F 2200/372* (2013.01)

(58) Field of Classification Search
CPC ...... H03G 3/3068; H03G 3/3078; H03F 1/32; H03F 2200/294; H03F 2200/372
See application file for complete search history.

(56) References Cited

U.S. PATENT DOCUMENTS

| | | | |
|---|---|---|---|
| 5,917,865 A | 6/1999 | Kopmeiners et al. | |
| 6,240,283 B1 | 5/2001 | Holcombe | |
| 10,742,185 B1* | 8/2020 | Li | ............................ H03M 1/12 |
| 10,819,302 B1* | 10/2020 | Srinivasan | ............. H04B 1/109 |
| 2001/0046846 A1 | 11/2001 | Tsumura | |
| 2003/0203726 A1 | 10/2003 | Kluge et al. | |

(Continued)

FOREIGN PATENT DOCUMENTS

| CN | 101867382 A | 10/2010 |
|---|---|---|
| CN | 111585535 A | 8/2020 |

(Continued)

*Primary Examiner* — Nguyen T Vo
(74) *Attorney, Agent, or Firm* — Kilpatrick Townsend & Stockton LLP

(57) ABSTRACT

A radio frequency (RF) receiver circuit is disclosed. The RF receiver circuit includes a variable gain amplifier, configured to receive an input RF signal, and to generate an amplified RF signal based on the input RF signal, where a gain of the variable gain amplifier is variable. The RF receiver circuit also includes an RF level indicator circuit, configured to sample the amplified RF signal at non-periodic sampling intervals to generate a plurality of sampled RF signals, and to compare the sampled RF signals with one or more thresholds to generate a plurality of comparison result signals. The gain of the variable gain amplifier is determined based at least in part on the comparison result signals.

20 Claims, 6 Drawing Sheets

(56) References Cited

U.S. PATENT DOCUMENTS

| | | | |
|---|---|---|---|
| 2007/0275686 A1* | 11/2007 | Stevenson | H03G 3/3068 |
| | | | 455/234.1 |
| 2007/0290913 A1 | 12/2007 | Schofield et al. | |
| 2013/0195215 A1* | 8/2013 | Manglani | H03G 3/3068 |
| | | | 375/295 |

FOREIGN PATENT DOCUMENTS

| | | |
|---|---|---|
| JP | 2018504075 A | 2/2018 |
| KR | 1020070097937 A | 10/2007 |

* cited by examiner

RADIO FREQUENCY LEVEL INDICATOR

CROSS-REFERENCES

This application claims priority from Provisional application No. 63/152,839, for "RADIO FREQUENCY LEVEL INDICATOR", filed Feb. 23, 2021, which is hereby incorporated by references in its entirety.

TECHNICAL FIELD

The subject matter described herein relates to a RF level indicator, and more particularly to an RF level indicator circuit providing improved sampling performance.

BACKGROUND

Receiver circuits having LNA circuits with variable gain suffer as a result of, for example, blocker signals which may cause the outputs of the LNA circuits to saturate. Receiver circuits having insufficient ability to sample LNA output correctly control the gain of the LNA circuit improperly, resulting in either inadequate LNA gain, which increases noise in the receiver output, or excessive gain, which causes clipping in the LNA output.

SUMMARY

One inventive aspect is a radio frequency (RF) receiver circuit, including a variable gain amplifier, configured to receive an input RF signal, and to generate an amplified RF signal based on the input RF signal, where a gain of the variable gain amplifier is variable, and an RF level indicator circuit, configured to sample the amplified RF signal at non-periodic sampling intervals to generate a plurality of sampled RF signals, and to compare the sampled RF signals with one or more thresholds to generate a plurality of comparison result signals, where the gain of the variable gain amplifier is determined based at least in part on the comparison result signals.

In some embodiments, the gain of the variable gain amplifier is reduced in response to a comparison result signal indicating that the amplified RF signal is out of range.

In some embodiments, the RF receiver circuit further includes a sample clock generator, configured to generate a sample clock based on a periodic reference clock, where the RF level indicator circuit is configured to generate the sampled RF signals in response to each of a series of pulses of the sample clock.

In some embodiments, the sample clock is non-periodic.

In some embodiments, the pulses of the sample clock have substantially the same duration.

In some embodiments, a magnitude of a difference between a maximum duration from a first sampling time to a first next successive sampling time and a minimum duration from a second sampling time to a second next successive sampling time is less than ½ of a period of the periodic reference clock.

In some embodiments, the RF receiver circuit further includes a mixer configured to receive the amplified RF signal and to generate a baseband signal based on the amplified RF signal, a filter configured to receive the baseband signal and to generate a filtered baseband signal based on the baseband signal from the mixer, an analog to digital converter configured to receive the filtered baseband signal and to generate a digital version of the filtered baseband signal based on the filtered baseband signal, and a controller configured to receive the digital version of the filtered baseband signal.

In some embodiments, the controller is configured to selectively cause the RF level indicator circuit to generate the comparison result signals and to not generate the comparison result signals.

In some embodiments, the controller is configured to selectively cause the RF level indicator circuit to generate the comparison result signals while the variable gain amplifier receives information encoding one or more preamble bits of an information packet.

In some embodiments, the controller is configured to selectively cause the RF level indicator circuit to not generate the comparison result signals after the variable gain amplifier no longer receives information encoding the preamble bits of the information packet.

Another inventive aspect is a method of using a radio frequency (RF) receiver circuit, the RF receiver circuit including a variable gain amplifier, where a gain of the variable gain amplifier is variable, and an RF level indicator circuit, the method including with the variable gain amplifier, receiving an input RF signal, with the variable gain amplifier, generating an amplified RF signal based on the input RF signal, with the RF level indicator circuit, sampling the amplified RF signal at non-periodic sampling intervals to generate a plurality of sampled RF signals, and with the RF level indicator circuit, comparing the sampled RF signals with one or more thresholds to generate a plurality of comparison result signals, where the gain of the variable gain amplifier is determined based at least in part on the comparison result signals.

In some embodiments, the method further includes reducing the gain of the variable gain amplifier in response to a comparison result signal indicating that the amplified RF signal is out of range.

In some embodiments, the RF receiver circuit further includes a sample clock generator, and the method further includes, with the sample clock generator, generating a sample clock based on a periodic reference clock, and, with the RF level indicator circuit, generating the sampled RF signals in response to each of a series of pulses of the sample clock.

In some embodiments, the sample clock is non-periodic.

In some embodiments, the pulses of the sample clock have substantially the same duration.

In some embodiments, a magnitude of a difference between a maximum duration from a first sampling time to a first next successive sampling time and a minimum duration from a second sampling time to a second next successive sampling time is less than ½ of a period of the periodic reference clock.

In some embodiments, the RF receiver circuit further includes a mixer, a filter, an analog to digital converter, and a controller, the method further including, with the mixer, receiving the amplified RF signal, with the mixer, generating a baseband signal based on the amplified RF signal, with the filter, receiving the baseband signal, with the filter, generating a filtered baseband signal based on the baseband signal from the mixer, with the analog to digital converter, receiving the filtered baseband signal, with the analog to digital converter, generating a digital version of the filtered baseband signal based on the filtered baseband signal, and with the controller, receiving the digital version of the filtered baseband signal.

In some embodiments, the method further includes, with the controller, selectively causing the RF level indicator circuit to generate the comparison result signals and to not generate the comparison result signals.

In some embodiments, the method further includes, with the controller, selectively causing the RF level indicator circuit to generate the comparison result signals while the variable gain amplifier receives information encoding one or more preamble bits of an information packet.

In some embodiments, the method further includes, with the controller, selectively causing the RF level indicator circuit to not generate the comparison result signals after the variable gain amplifier no longer receives information encoding the preamble bits of the information packet.

DESCRIPTION OF DRAWINGS

The accompanying drawings, which are incorporated in and constitute a part of this specification, show certain aspects of the subject matter disclosed herein and, together with the description, help explain some of the principles associated with the disclosed implementations.

When practical, similar reference numbers denote similar structures, features, or elements.

DETAILED DESCRIPTION

Particular embodiments of the invention are illustrated herein in conjunction with the drawings.

Various details are set forth herein as they relate to certain embodiments. However, the invention can also be implemented in ways which are different from those described herein. Modifications can be made to the discussed embodiments by those skilled in the art without departing from the invention. Therefore, the invention is not limited to particular embodiments disclosed herein.

Figure 1:
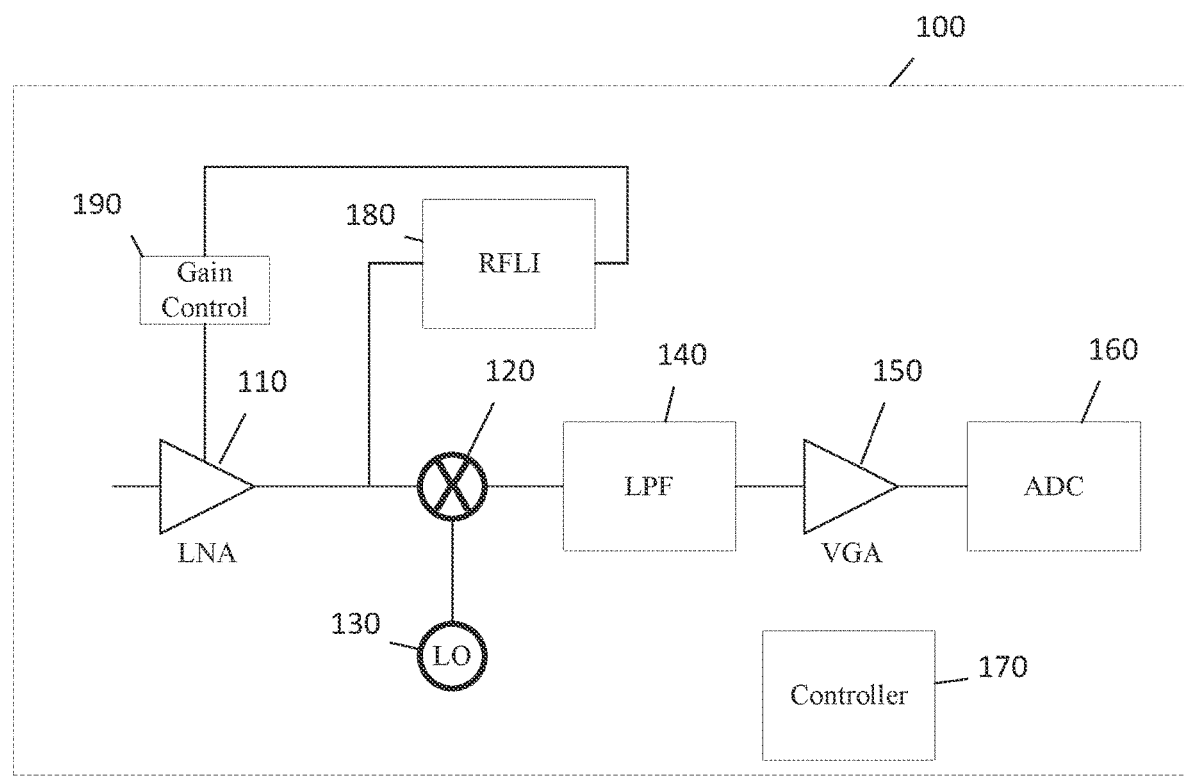
FIG. 1 is a schematic diagram of an embodiment of a receiver circuit having an LNA circuit.
Figure 2:
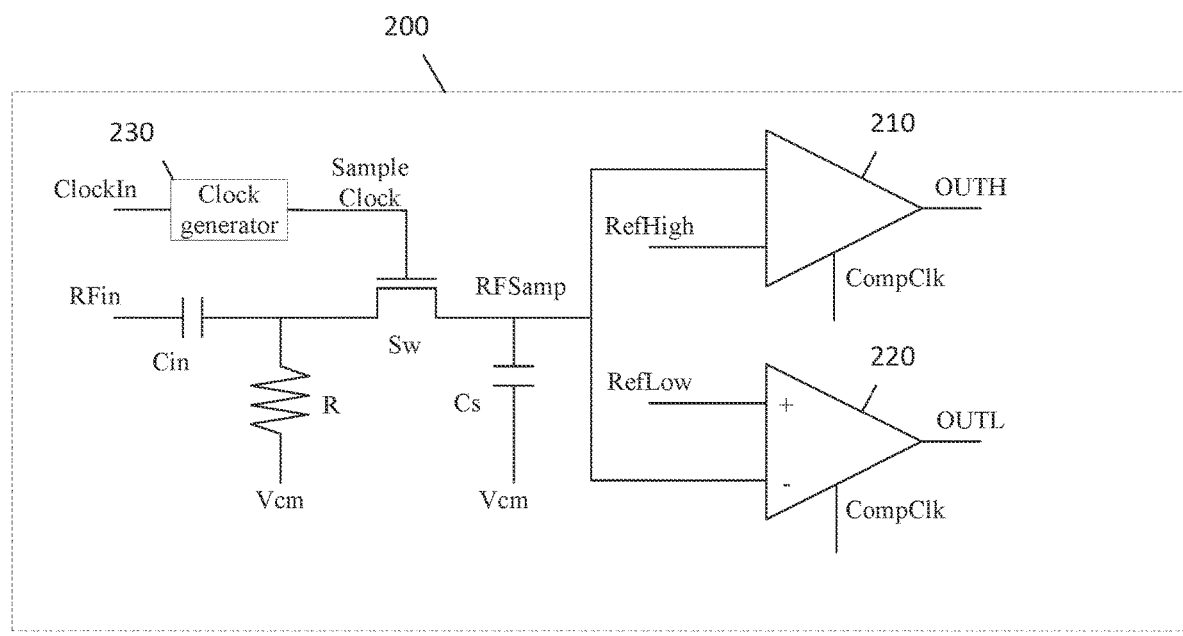
FIG. 2 is a schematic diagram of an embodiment of an RF level indicator circuit.
Figure 3:
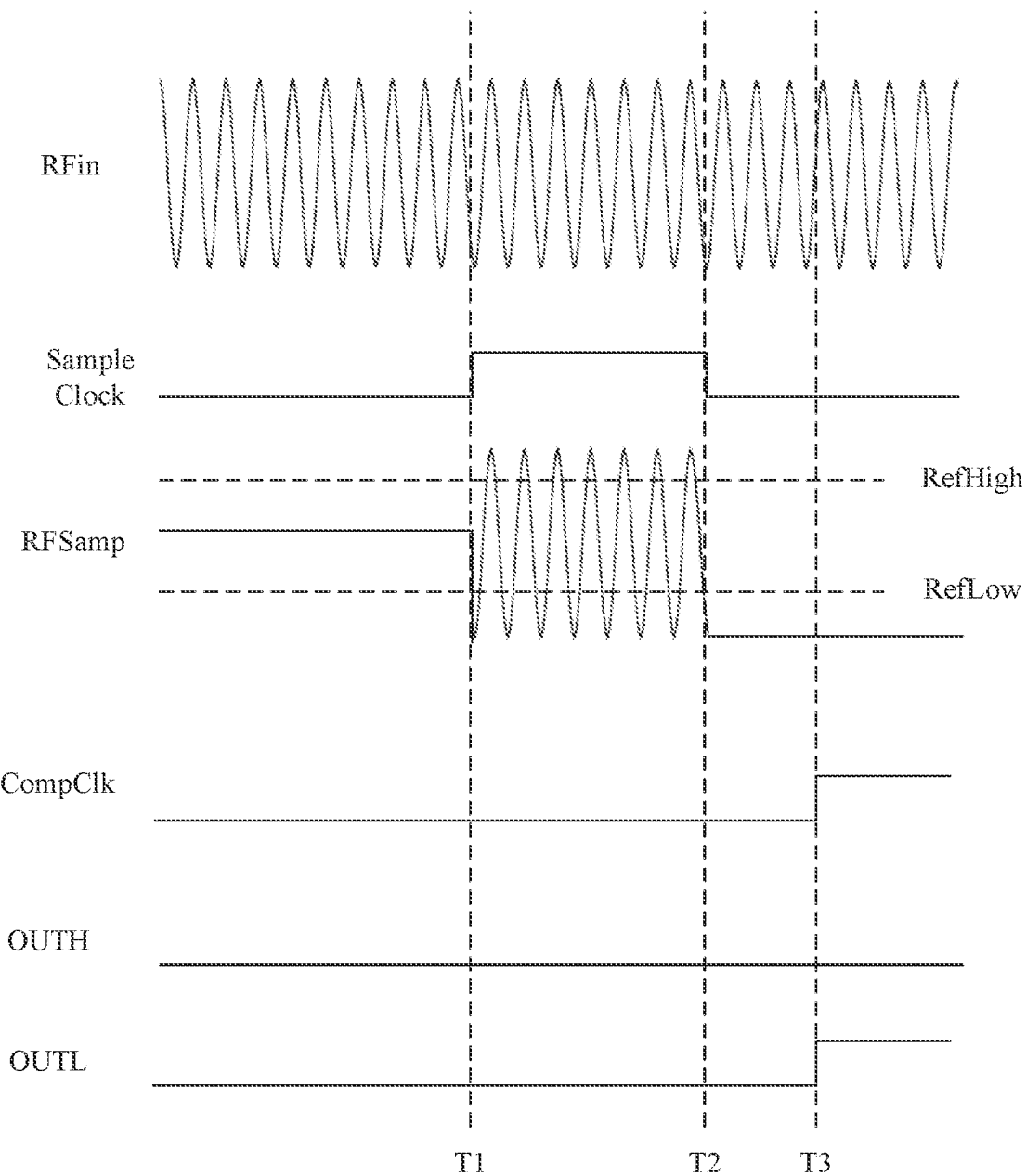
FIG. 3 is a waveform diagram illustrating functionality of the RF level indicator circuit of FIG. 2.
Figure 4:
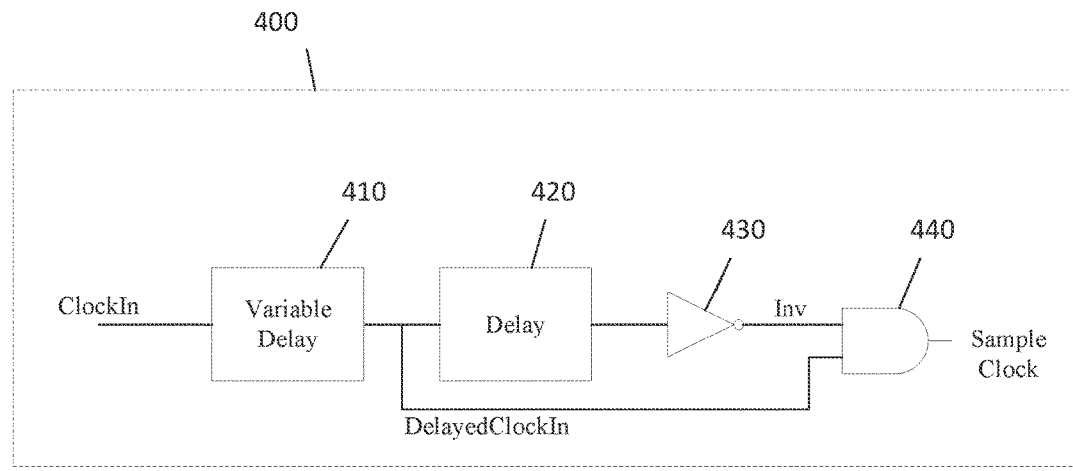
FIG. 4 is a schematic diagram of an embodiment of a variable delay sample pulse generator.
Figure 5:
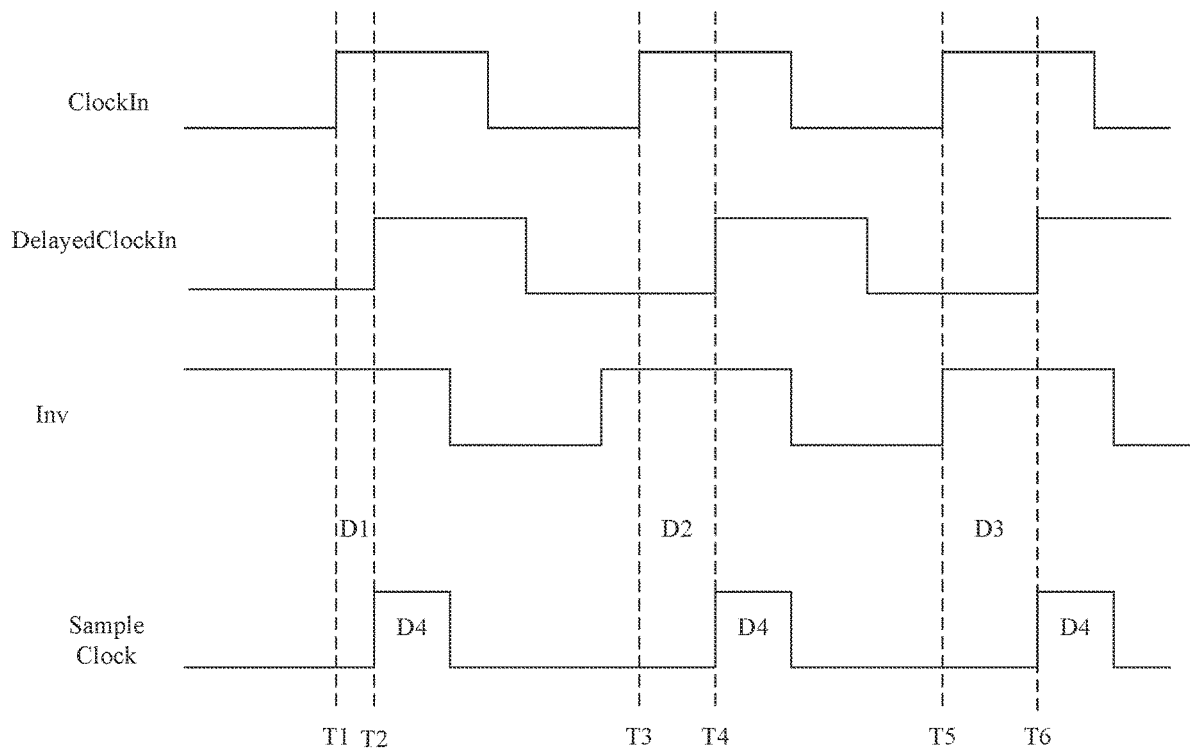
FIG. 5 is a waveform diagram illustrating functionality of the sample pulse generator of FIG. 4.
Figure 6:
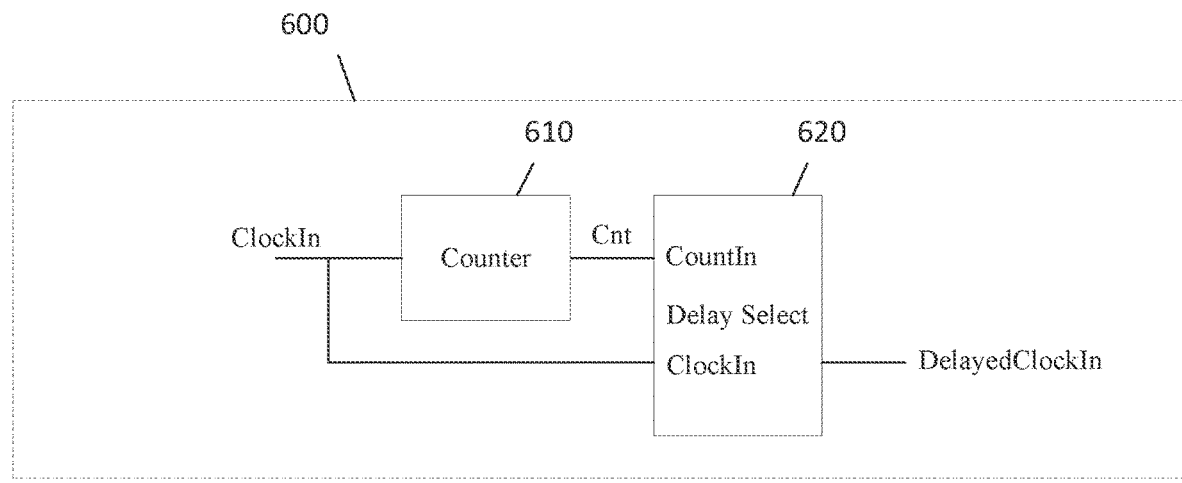
FIG. 6 is a schematic illustration of an embodiment of a variable clock delay circuit.
Figure 7:
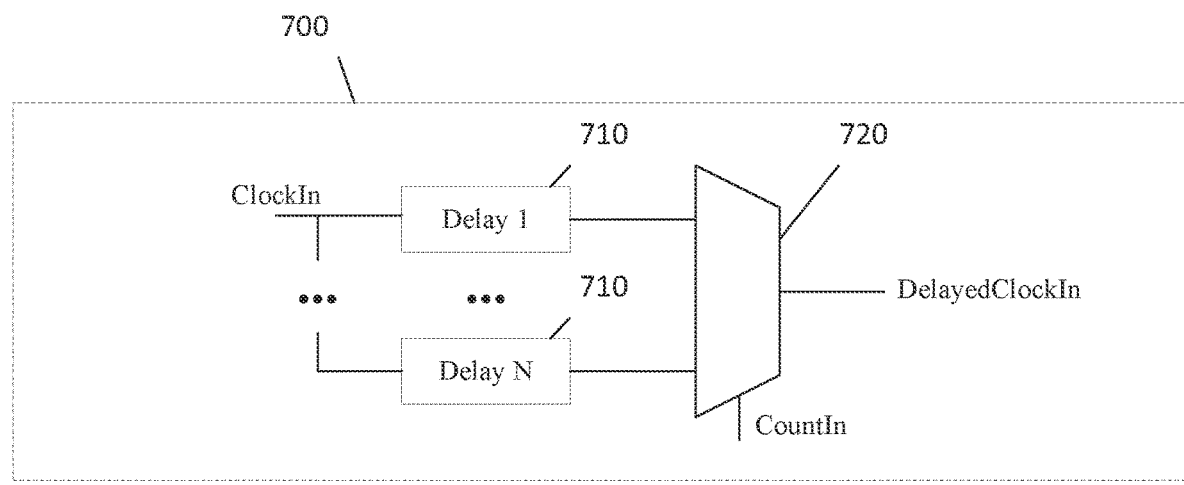
FIG. 7 is a schematic illustration of an embodiment of a delay select circuit.
Figure 8:
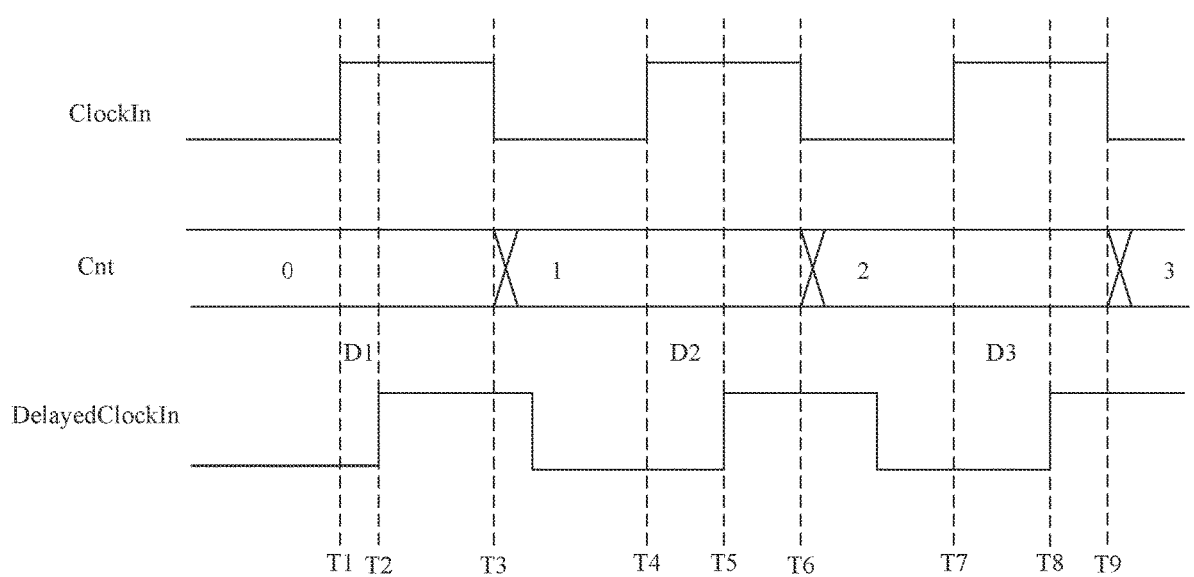
FIG. 8 is a waveform diagram illustrating functionality of the variable clock delay circuit of FIG. 6 using the delay select circuit of FIG. 7.

Circuit features of Radio Frequency Level Indicator (RFLI) circuits providing excellent RF signal sampling performance are described herein with reference to certain embodiments. As discussed in more detail below, the RFLI circuits are able to quickly sample RF inputs to determine whether the magnitude of the RF input exceeds a threshold. In addition, the RFLI circuits provide good sampling performance over a broad input bandwidth. Some of the features of the RFLI circuits are illustrated in the figures. FIG. 1 illustrates an embodiment of a receiver circuit having an LNA circuit. FIGS. 2 and 3 illustrate an embodiment of an RF level indicator circuit, and its functionality. FIGS. 4 and 5 illustrate a variable delay sample pulse generator, and its functionality. FIGS. 6-8 illustrate a variable clock delay circuit, and its functionality.

FIG. 1 is a schematic diagram of an embodiment of a receiver circuit 100 having a variable gain LNA circuit 110, mixer 120 which receives an oscillator signal from oscillator (LO) 130, low-pass filter (LPF) 140, variable gain amplifier (VGA) 150, analog-to-digital converter (ADC) 160, controller 170, RFLI circuit 180, and gain control 190.

Variable gain low noise amplifier 110 is configured to receive a high-frequency carrier signal modulated with a low frequency information signal. The received signal may also include a blocker signal, such as an unrelated signal, distinct from the information signal, having a frequency near, but outside the frequency bandwidth of the receiver, where the unrelated signal also modulates the high-frequency carrier signal. The blocker signal may have higher power than the information signal, and may occur at any frequency. Variable gain low noise amplifier 110 may have features of any low noise amplifier or amplifier having variable gain, as understood by those of skill in the art.

RFLI circuit 180, discussed in further detail below, is configured to determine whether the minimums and/or maximums of the output from variable gain low noise amplifier 110 cross desirable range thresholds. In response to determining that the minimums and/or maximums of the output from variable gain low noise amplifier 110 cross desirable range thresholds, RFLI circuit 180 generates an out of range signal for gain control circuit 190.

At least for reasons discussed below, RFLI circuit 180 is able to quickly sample RF inputs to determine whether the minimums and/or maximums of the output from variable gain low noise amplifier 110 cross desirable range thresholds. In addition, at least for reasons discussed below, the RFLI circuit 180 provides good sampling performance over a broad input bandwidth.

Therefore, RFLI circuit 180 is particularly effective for determining whether the minimums and/or maximums of the output from variable gain low noise amplifier 110 cross desirable range thresholds, for example, as a result of a blocker signal, because the gain control circuitry is able to quickly sample and modify the gain of the variable gain low noise amplifier 110, and has sampling performance which is independent or substantially independent of the frequency of the output of variable gain low noise amplifier 110 at least for frequencies at or near the frequency of the carrier signal.

For example, conventional methods of determining whether the minimums and/or maximums of the output from a variable gain low noise amplifier cross desirable range thresholds may be slow, requiring, for example, hundreds of samples. Other conventional methods of determining whether the minimums and/or maximums of the output from variable gain low noise amplifier 110 cross desirable range thresholds fail for particular frequencies. This is especially problematic for blocker signals, which have unknown frequencies.

Gain control 190 is configured to generate a gain control signal for low noise amplifier 110. For example, in response to receiving an out of range signal from RFLI circuit 180, gain control circuit 190 may reduce the gain of variable gain low noise amplifier 110.

For example, controller 170 may determine that the RFLI circuit 180 is to be used to adjust the gain of the variable gain low noise amplifier 110. For example, controller 170 may determine that receiver circuit 100 is receiving or is to receive an information packet having a number of preamble bits which are received before payload data bits of the information packet. Controller 170 may cause the RFLI circuit 180 to detect whether the output of the variable gain low noise amplifier 110 moves outside the desirable range, for example, while the variable gain low noise amplifier 110 receives information encoding the preamble bits. In some embodiments, once one or more of the preamble bits have been received, controller 170 causes the RFLI circuit 180 to no longer influence the gain control circuit 190.

In some embodiments, a gain control loop including variable gain low noise amplifier 110, RFLI circuit 180, and gain control circuit 190 is able to adjust the gain of the variable gain low noise amplifier 110 so that the minimums and/or maximums of the output from variable gain low noise amplifier 110 do not cross desirable range thresholds by sampling 1, 2, 3, 4, 5, 6, 7, 8, 9, 10, 11, 12, 13, 14, 15, or 16 bits. In some embodiments, the gain control loop is able to adjust the gain of the variable gain low noise amplifier 110 so that the minimums and/or maximums of the output from variable gain low noise amplifier 110 do not cross desirable range thresholds by sampling another number of bits.

In some embodiments, each bit may be sampled many times. For example, each preamble bit may be sampled about 3, 4, 5, 10, 15, 20, 25, 35, 50, 75, 100, or another number of times, according to a difference between the sampling rage and the bit rate.

In some embodiments, the sampled bits are preamble bits. In some embodiments, at least some of the bits are not preamble bits. In some embodiments, at least some of the bits are data bits. At least as discussed above, quick determination of the proper gain of the variable gain low noise amplifier 110 is advantageous.

In some embodiments, gain control 190 receives input from sources other than the RFLI circuit 180, and generates a gain control signal for low noise amplifier 110 based additionally on the input from the other sources, for example, using circuit techniques understood by those of skill in the art.

In response to the output from the variable gain low noise amplifier 110 and the oscillator signal, mixer 120 down converts the signal from the variable gain low noise amplifier 110. The resulting baseband signal includes information of the low frequency information signal.

The baseband signal is then processed by the low-pass filter 140, as understood by those of skill in the art.

The output of the low-pass filter 140 is then processed by the variable gain amplifier 150, as understood by those of skill in the art.

The output of the variable gain variable gain amplifier 150 is then processed by the analog-to-digital converter 160, and provides a digital representation of the information signal to controller 170, as understood by those of skill in the art.

Alternatively or additionally, one or more additional level indicator circuits having features similar or identical to those discussed herein with reference to RFLI circuit 180 may be used in receiver circuit 100. For example, one or more additional level indicator circuits may respectively receive input signals from any of the outputs of mixer 120, low-pass filter 140, and variable gain amplifier 150, and may generate outputs which affect the gain of any of mixer 120, low-pass filter 140, and variable gain amplifier 150, as understood by those of skill in the art.

FIG. 2 is a schematic diagram of an embodiment of an RF level indicator circuit 200. RF level indicator circuit 200 may be used as RFLI circuit 180 of FIG. 1. Other RF level indicator circuits having features similar or identical to RF level indicator circuit 200 may be used as RFLI circuit 180 of FIG. 1.

RF level indicator circuit 200 includes input capacitor Cin, bias resistor R, sampling switch Sw, sampling capacitor Cs, high reference comparator 210, low reference comparator 220, and sampling clock generator 230.

The RF signal at node RFin is capacitively coupled to the input node of the sampling switch Sw, which is biased to bias voltage at node Vcm by bias resistor R, as understood by those of skill in the art.

According to the sampling clock signal at the gate of sampling switch Sw, sampling switch Sw selectively passes the capacitively coupled RF signal to node RFSamp, as understood by those of skill in the art. Furthermore, in response to the sampling clock signal causing sampling switch Sw to become nonconductive, the sampled voltage at node RFSamp is held substantially constant by sampling capacitor Cs, as understood by those of skill in the art.

The sampling clock generator 230 receives a clock signal at node ClockIn. The clock signal has a frequency which is equal to a nominal sampling frequency.

While the sampled voltage at node RFSamp is held by sampling capacitor Cs, the comparator clock signal at node CompClk causes high reference comparator 210 to compare the sampled voltage at node RFSamp with the high reference voltage at node RefHigh. In response to the sampled voltage at node RFSamp being greater than the high reference voltage, high reference comparator 210 causes the voltage at output node OUTH to be high. In response to the sampled voltage at node RFSamp being less than the high reference voltage, high reference comparator 210 causes the voltage at output node OUTH to be low.

While the sampled voltage at node RFSamp is held by sampling capacitor Cs, the comparator clock signal at node CompClk causes low reference comparator 220 to compare the sampled voltage at node RFSamp with the low reference voltage at node RefLow. In response to the sampled voltage at node RFSamp being greater than the low reference voltage, low reference comparator 220 causes the voltage at output node OUTL to be low. In response to the sampled voltage at node RFSamp being less than the low reference voltage, low reference comparator 220 causes the voltage at output node OUTL to be high.

Either of the voltages at output nodes OUTH and OUTL being high provides an indication that the RF signal received at node RFin is out of range.

The high reference voltage may be generated using any circuit and is not limited. In some embodiments, the high reference voltage is generated by a resistor ladder, as understood by those of skill in the art. In some embodiments, the high reference voltage is programmable. For example, controller 170 may cause one of a number of reference voltages, for example, generated by the resistor ladder, to be provided to the node RefHigh as the high reference voltage.

The low reference voltage may be generated using any circuit and is not limited. In some embodiments, the low reference voltage is generated by a resistor ladder, as understood by those of skill in the art. In some embodiments, the low reference voltage is programmable. For example, controller 170 may cause one of a number of reference voltages, for example, generated by the resistor ladder, to be provided to the node RefLow as the low reference voltage.

In some embodiments, the resistor ladder of the high reference voltage may be the same resistor ladder or an extension of the same resistor ladder as that of the low reference voltage. In some embodiments, the resistor ladder of the high reference voltage and the low reference voltage also generates the bias voltage at node Vcm, where the bias voltage at node Vcm is the average of the high reference voltage and the low reference voltage.

FIG. 3 is a waveform diagram illustrating functionality of the RF level indicator circuit of FIG. 2.

The RF signal at node RFin is capacitively coupled to the input node of the sampling switch Sw, and, at time T1, the sampling clock signal at node Sample Clock causes sampling switch Sw to pass the capacitively coupled RF signal to node RFSamp. In addition, at time T2, the sampling clock signal causes sampling switch Sw to become nonconductive. Thereafter, the voltage at node RFSamp is held substantially constant by sampling capacitor Cs.

While the sampled voltage at node RFSamp is held by sampling capacitor Cs, at T3, the comparator clock signal at node CompClk causes high reference comparator 210 to compare the sampled voltage at node RFSamp with the high reference voltage at node RefHigh. In response to the sampled voltage at node RFSamp being less than the high reference voltage, as shown in FIG. 3, high reference comparator 210 causes the voltage at output node OUTH to be low.

While the sampled voltage at node RFSamp is held by sampling capacitor Cs, at T3, the comparator clock signal at node CompClk causes low reference comparator 220 to compare the sampled voltage at node RFSamp with the low reference voltage at node RefLow. In response to the sampled voltage at node RFSamp being less than the low reference voltage, low reference comparator 220 causes the voltage at output node OUTL to be high.

The voltage at output nodes OUTL being high provides an indication that the RF signal received at node RFin is out of range.

As understood by those of skill in the art, because the RF signal at node RFin is periodic, if the sampling clock is also periodic, the sampled voltages at node RFSamp will also be periodic or DC. This is problematic for some ratios of the period of the RF signal to the period of the sampling clock. For example, for ratios equal or about equal to whole numbers, the sampled voltages at node RFSamp form a DC or about DC signal, which may be inadequate for determining whether the RF signal is out of range. Other rational ratios may also provide sampled voltages at node RFSamp which are inadequate for determining whether the RF signal is out of range.

To reduce or eliminate the possibility of inadequate sampled voltages, in some embodiments, the sampling clock is generated so as to not be periodic, or to not be periodic over a gain adjustment duration.

FIG. 4 is a schematic diagram of an embodiment of a variable delay sample pulse generator 400. Variable delay sample pulse generator 400 may be used as the clock generator circuit 230 of FIG. 2. Other clock generator circuits may alternatively be used for the clock generator circuit 230 of FIG. 2.

Variable delay sample pulse generator 400 includes variable delay circuit 410, delay circuit 420, inverter 430, and AND gate 440.

Variable delay sample pulse generator 400 receives an input clock signal at node ClockIn. The input clock signal has a frequency which is equal to a nominal sampling frequency. For each period of the input clock signal, variable delay sample pulse generator 400 generates a sample pulse. However, the timing relationship between each generated sample pulse and the particular input clock period causing the sample pulse is variable, as discussed below.

Variable delay circuit 410 receives the input clock signal at node ClockIn. Variable delay circuit 410 generates a delayed version of the input clock signal for delay circuit 420 and for AND gate 440. A non-limiting example of a variable delay circuit 410 is discussed below.

The timing relationship between each particular period of the delayed version of the input clock signal and the particular input clock signal period causing the particular period of the delayed version of the input clock signal changes. For example, a first time delay between a first input clock signal period and a first delayed input clock signal period is less than a second time delay between a second input clock signal period and a second delayed input clock signal period, for example, as discussed below with reference to the example embodiment of FIGS. 6-8.

Delay circuit 420 receives the delayed version of the input clock signal from variable delay circuit 410, and generates a further delayed version of the input clock signal for inverter 430. In some embodiments, the delay of delay circuit 420 is substantially constant. In some embodiments, the delay of delay circuit 420 is programmable, for example, by a controller, such as controller 170, for example, using techniques similar or identical to that discussed elsewhere with reference to variable delay circuit 410, as understood by those of skill in the art.

In some embodiments, delay circuit 420 is programmable and has features similar or identical to that discussed elsewhere with reference to variable delay circuit 410, and variable delay circuit 410 is omitted, such that the input clock signal is provided to a programmable delay circuit 420 and to AND gate 440.

In the illustrated embodiment, inverter 430 receives the further delayed version of the input clock signal from delay circuit 420, and generates an inverted clock signal for AND gate 440.

AND gate 440 receives the delayed version of the input clock signal from variable delay circuit 410 and receives the inverted clock signal from inverter 430. Based on the received delayed version of the input clock signal and the inverted clock signal, AND gate 440 generates sample clock pulses at output Sample Clock. As understood by those of skill in the art, AND gate 440 generates a sample clock pulse at output Sample Clock for each rising edge of the delayed version of the input clock signal.

In some embodiments, inverter 430 is replaced with an AND gate configured to receive the further delayed version of the input clock signal from delay circuit 420 at one of its inputs, and to receive an enable signal from a controller, such as controller 170 of receiver circuit 100, at another of its inputs.

In embodiments of receiver circuit 100 using these embodiments of inverter 430, the controller 170 may control the enable signal to selectively cause the RFLI circuit 180 to sample the output of the variable gain low noise amplifier 110 to detect whether the output of the variable gain low noise amplifier 110 moves outside the desirable range, for example, while the variable gain low noise amplifier 110 receives information encoding the preamble bits. In these embodiments, after one or more of the preamble bits have been received, the controller may control the enable signal to cause the RFLI circuit 180 to no longer sample the output of the variable gain low noise amplifier 110 to influence the gain control circuit 190.

As understood by those of skill in the art, other pulse generator circuits having features similar or identical to those of variable delay sample pulse generator 400 may be used.

FIG. 5 is a waveform diagram illustrating functionality of the variable delay sample pulse generator 400 of FIG. 4.

At time T1, the input clock signal at node ClockIn transitions high.

Prior to time T2, the output of inverter 430 at node Inv is high because of the previous low state of the delayed version of the input clock signal at node DelayedClockIn.

After a first delay time, D1, determined by variable delay circuit 410, at time T2, the delayed version of the input clock signal at node DelayedClockIn transitions high. Additionally, in response to the delayed version of the input clock signal at node DelayedClockIn transitioning high, the sample clock output transitions high. Accordingly, a first delay time D1 after the input clock signal at node ClockIn transitions high, the sample clock output transitions high.

Then, a substantially fixed delay time D4 after time T2, the output of inverter 430 at node Inv transitions low because of the high state of the delayed version of the input clock signal at node DelayedClockIn, and the input clock signal at node ClockIn transitions low, where the substantially fixed delay time D4 is determined by the combined delay of delay circuit 420, inverter 430, and AND gate 440, as understood by those of skill in the art.

At time T3, the input clock signal at node ClockIn again transitions high.

Prior to time T4, the output of inverter 430 at node Inv is high because of the previous low state of the delayed version of the input clock signal at node DelayedClockIn.

After a second delay time, D2, determined by variable delay circuit 410, at time T4, the delayed version of the input clock signal at node DelayedClockIn transitions high. Additionally, in response to the delayed version of the input clock signal at node DelayedClockIn transitioning high, the sample clock output transitions high. Accordingly, a second delay time D2 after the input clock signal at node ClockIn transitions high, the sample clock output transitions high.

Then, a substantially fixed delay time D4 after time T4, the output of inverter 430 at node Inv transitions low because of the high state of the delayed version of the input clock signal at node DelayedClockIn, and the input clock signal at node ClockIn transitions low, where the substantially fixed delay time D4 is determined by the combined delay of delay circuit 420, inverter 430, and AND gate 440, as understood by those of skill in the art.

At time T5, the input clock signal at node ClockIn again transitions high.

Prior to time T6, the output of inverter 430 at node Inv is high because of the previous low state of the delayed version of the input clock signal at node DelayedClockIn.

After a third delay time, D3, determined by variable delay circuit 410, at time T6, the delayed version of the input clock signal at node DelayedClockIn transitions high. Additionally, in response to the delayed version of the input clock signal at node DelayedClockIn transitioning high, the sample clock output transitions high. Accordingly, a third delay time D3 after the input clock signal at node ClockIn transitions high, the sample clock output transitions high.

Then, a substantially fixed delay time D4 after time T6, the output of inverter 430 at node Inv transitions low because of the high state of the delayed version of the input clock signal at node DelayedClockIn, and the input clock signal at node ClockIn transitions low, where the substantially fixed delay time D4 is determined by the combined delay of delay circuit 420, inverter 430, and AND gate 440, as understood by those of skill in the art.

As illustrated, the first second and third delay times D1, D2, and D3 are different, where delay time D2>delay time D1 and delay time D3>delay time D2.

FIG. 6 is a schematic illustration of an embodiment of a variable clock delay circuit 600. Variable clock delay circuit 600 may be used as variable delay circuit 410 of variable delay sample pulse generator 400. In some embodiments, other variable clock delay circuits having features similar or identical to that of variable clock delay circuit 600 may be used as variable delay circuit 410 of variable delay sample pulse generator 400, as understood by those of skill in the art.

Variable clock delay circuit 600 receives the input clock signal at node ClockIn. Variable clock delay circuit 600 also generates a delayed version of the input clock signal at output node DelayedClockIn based on the received input clock signal.

Variable clock delay circuit 600 includes counter 610 and delay select circuit 620.

Counter 610 receives the input clock signal at node ClockIn. Counter 610 also generates a count output at node Cnt for delay select circuit 620 based on the received input clock signal. Counter 610 may have features of any counter circuit known in the art, and is not limited. Counter 610 may have a number of bits corresponding with the number of selectable delay circuits of delay select circuit 620, as discussed in further detail below, as understood by those of skill in the art. For example, counter 610 may have three bits and delay select circuit 620 may have eight selectable delay circuits, as understood by those of skill in the art.

Delay select circuit 620 receives the input clock signal at node ClockIn the count output from counter 610 at node Cnt. In addition, delay select circuit 620 generates a delayed version of the input clock signal at output node DelayedClockIn as an output clock, where the delay between the received input clock signal and the output clock is programmable, and is based on the count output from counter 610, for example, as discussed below with reference to the delay select circuit 700 of FIG. 7.

FIG. 7 is a schematic illustration of an embodiment of a delay select circuit 700. Delay select circuit 700 may be used as the delay select circuit 620 of variable clock delay circuit 600. In some embodiments, other delay select circuits having features similar or identical to that of delay select circuit 700 may be used as the delay select circuit 620 of variable clock delay circuit 600, as understood by those of skill in the art.

Delay select circuit 700 includes N delay circuits 710, and a multiplexer circuit 720.

Each of the N delay circuits 710 receives the input clock signal at node ClockIn, and generates a delayed version of the input clock signal based on the received input clock signal. Each of the N delayed versions of the input clock signal may be delayed by a different time duration.

For example, delay circuit 1 may generate a delayed version of the input clock signal which is delayed by a first propagation delay time, such as about 1 ns, and delay circuit 2 may generate a delayed version of the input clock signal which is delayed by about 1%, about 2%, about 3%, about 4%, or about 5% more or less than the first propagation delay time of delay circuit 1. In some embodiments, the relationship of three or more consecutive, or all of the different propagation delay times among the N delay circuits 710 is linear or is about linear. In some embodiments, the relationship of three or more consecutive, or all the different propagation delay times among the N delay circuits 710 is not linear. In some embodiments, the relationship of three or more consecutive, or all the different propagation delay times among the N delay circuits 710 is logarithmic.

In some embodiments, the propagation delay of the delay circuit 710 having the longest propagation delay is longer than the propagation delay of the delay circuit 710 having the shortest propagation delay by a difference less than ½ the period of the input clock signal at node ClockIn. In some embodiments, the propagation delay of the delay circuit 710 having the longest propagation delay is longer than the propagation delay of the delay circuit 710 having the shortest propagation delay by a difference less than ¼ the period of the input clock signal at node ClockIn.

Accordingly, the sample pulses of the sample clock do not occur at periodic intervals. Consequently, the set of sampled voltages are not DC and are not periodic. At least for reasons discussed elsewhere herein, non-periodic sample pulses are advantageous, for example, to ensure that the gain of the variable delay low noise amplifier 110 is properly adjusted, for example, while the variable delay low noise amplifier 110 receives the preamble bits of an information packet and before the data payload of the information packet.

Each of the N delay circuits 710 may comprise an inverter or two or more serially connected inverters, where the total propagation delay of each of the N delay circuits 710 is different. In some embodiments, the propagation delays of the N delay circuits 710 are different because the inverters of the respective N delay circuits 710 are different sizes, as understood by those of skill in the art. In some embodiments, the propagation delays of the N delay circuits 710 are different because capacitances of the inverters of the respective N delay circuits 710 are different, as understood by those of skill in the art. In some embodiments, the propagation delays of the N delay circuits 710 are different because a quantity of the inverters of the respective N delay circuits 710 are different, as understood by those of skill in the art.

In alternative embodiments, one or more of the delayed versions of the input clock signal are generated by a single delay line having multiple taps, as understood by those of skill in the art.

Multiplexer 720 receives each of the delayed versions of the input clock signal from the N delay circuits 710. In addition, multiplexer 720 receives the count output from counter 610 at input node CountIn. Furthermore, multiplexer 720 generates an output clock at output node DelayedClockIn based on a selected one of the delayed versions of the input clock signal, where the selection of which of the delayed versions of the input clock signal is determined based on the count output at input node CountIn, as understood by those of skill in the art. Any multiplexer circuit may be used.

FIG. 8 is a waveform diagram illustrating functionality of the variable clock delay circuit 600 using delay select circuit 700.

At time T1, with the output of counter 610 at node Cnt equal to 0, the input clock signal at node ClockIn transitions high.

After a first delay time D1, at time T2, the delayed version of the input clock signal at node DelayedClockIn transitions high. The particular first delay time D1 is determined by delay select circuit 620 based on the count output at node Cnt being equal to 0.

At time T3, with the count output of counter 610 at node Cnt equal to 0, the input clock signal at node ClockIn transitions low. In response to the input clock signal at node ClockIn transitioning low, counter 610 increments the count output at node Cnt to 1.

At time T4, with the output of counter 610 at node Cnt equal to 1, the input clock signal at node ClockIn transitions high.

After a second delay time D2, at time T5, the delayed version of the input clock signal at node DelayedClockIn transitions high. The particular second delay time D2 is determined by delay select circuit 620 based on the count output at node Cnt being equal to 1.

At time T6, with the count output of counter 610 at node Cnt equal to 1, the input clock signal at node ClockIn transitions low. In response to the input clock signal at node ClockIn transitioning low, counter 610 increments the count output at node Cnt to 2.

At time T7, with the output of counter 610 at node Cnt equal to 2, the input clock signal at node ClockIn transitions high.

After a third delay time D3, at time T8, the delayed version of the input clock signal at node DelayedClockIn transitions high. The particular third delay time D3 is determined by delay select circuit 620 based on the count output at node Cnt being equal to 2.

At time T9, with the count output of counter 610 at node Cnt equal to 2, the input clock signal at node ClockIn transitions low. In response to the input clock signal at node ClockIn transitioning low, counter 610 increments the count output at node Cnt to 3.

As illustrated, the first second and third delay times D1, D2, and D3 are different, where delay time D2>delay time D1 and delay time D3>delay time D2.

This pattern continues, as understood by those of skill in the art, until the counter reaches its maximum count value. Subsequently, the counter rolls over to a count value equal to 0, and the pattern repeats, as understood by those of skill in the art.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. A radio frequency (RF) receiver circuit, comprising:
a variable gain amplifier, configured to receive an input RF signal, and to generate an amplified RF signal based on the input RF signal, wherein a gain of the variable gain amplifier is variable; and
an RF level indicator circuit, configured to sample the amplified RF signal at non-periodic sampling intervals to generate a plurality of sampled RF signals, and to compare the sampled RF signals with one or more thresholds to generate a plurality of comparison result signals,
wherein the gain of the variable gain amplifier is determined based at least in part on the comparison result signals.

2. The receiver circuit of claim 1, wherein the gain of the variable gain amplifier is reduced in response to a comparison result signal indicating that the amplified RF signal is out of range.

3. The receiver circuit of claim 1, further comprising:
a sample clock generator, configured to generate a sample clock based on a periodic reference clock,
wherein the RF level indicator circuit is configured to generate the sampled RF signals in response to each of a series of pulses of the sample clock.

4. The receiver circuit of claim 3, wherein the sample clock is non-periodic.

5. The receiver circuit of claim 3, wherein the pulses of the sample clock have substantially the same duration.

6. The receiver circuit of claim 3, wherein a magnitude of a difference between a maximum duration from a first sampling time to a first next successive sampling time and a minimum duration from a second sampling time to a second next successive sampling time is less than ½ of a period of the periodic reference clock.

7. The receiver circuit of claim 1, further comprising:
a mixer configured to receive the amplified RF signal and to generate a baseband signal based on the amplified RF signal;
a filter configured to receive the baseband signal and to generate a filtered baseband signal based on the baseband signal from the mixer;
an analog to digital converter configured to receive the filtered baseband signal and to generate a digital version of the filtered baseband signal based on the filtered baseband signal; and
a controller configured to receive the digital version of the filtered baseband signal.

8. The receiver circuit of claim 7, wherein the controller is configured to selectively cause the RF level indicator circuit to generate the comparison result signals and to not generate the comparison result signals.

9. The receiver circuit of claim 8, wherein the controller is configured to selectively cause the RF level indicator circuit to generate the comparison result signals while the variable gain amplifier receives information encoding one or more preamble bits of an information packet.

10. The receiver circuit of claim 9, wherein the controller is configured to selectively cause the RF level indicator circuit to not generate the comparison result signals after the variable gain amplifier no longer receives information encoding the preamble bits of the information packet.

11. A method of using a radio frequency (RF) receiver circuit, the RF receiver circuit comprising a variable gain amplifier, wherein a gain of the variable gain amplifier is variable, and an RF level indicator circuit, the method comprising:
with the variable gain amplifier, receiving an input RF signal;
with the variable gain amplifier, generating an amplified RF signal based on the input RF signal;
with the RF level indicator circuit, sampling the amplified RF signal at non-periodic sampling intervals to generate a plurality of sampled RF signals; and
with the RF level indicator circuit, comparing the sampled RF signals with one or more thresholds to generate a plurality of comparison result signals,
wherein the gain of the variable gain amplifier is determined based at least in part on the comparison result signals.

12. The method of claim 11, further comprising reducing the gain of the variable gain amplifier in response to a comparison result signal indicating that the amplified RF signal is out of range.

13. The method of claim 11, wherein the RF receiver circuit further comprises a sample clock generator, the method further comprising:
with the sample clock generator, generating a sample clock based on a periodic reference clock; and
with the RF level indicator circuit, generating the sampled RF signals in response to each of a series of pulses of the sample clock.

14. The method of claim 13, wherein the sample clock is non-periodic.

15. The method of claim 13, wherein the pulses of the sample clock have substantially the same duration.

16. The method of claim 13, wherein a magnitude of a difference between a maximum duration from a first sampling time to a first next successive sampling time and a minimum duration from a second sampling time to a second next successive sampling time is less than ½ of a period of the periodic reference clock.

17. The method of claim 11, wherein the RF receiver circuit further comprises a mixer, a filter, an analog to digital converter, and a controller, the method further comprising:
with the mixer, receiving the amplified RF signal;
with the mixer, generating a baseband signal based on the amplified RF signal;
with the filter, receiving the baseband signal;
with the filter, generating a filtered baseband signal based on the baseband signal from the mixer;
with the analog to digital converter, receiving the filtered baseband signal;
with the analog to digital converter, generating a digital version of the filtered baseband signal based on the filtered baseband signal; and
with the controller, receiving the digital version of the filtered baseband signal.

18. The method of claim 17, with the controller, selectively causing the RF level indicator circuit to generate the comparison result signals and to not generate the comparison result signals.

19. The method of claim 18, with the controller, selectively causing the RF level indicator circuit to generate the comparison result signals while the variable gain amplifier receives information encoding one or more preamble bits of an information packet.

20. The method of claim 19, with the controller, selectively causing the RF level indicator circuit to not generate the comparison result signals after the variable gain amplifier no longer receives information encoding the preamble bits of the information packet.

\* \* \* \* \*